(12) United States Patent
Ishimori et al.

(10) Patent No.: US 8,926,069 B2
(45) Date of Patent: Jan. 6, 2015

(54) PIEZOELECTRIC THIN FILM ELEMENT AND METHOD OF MANUFACTURING THE SAME, DROPLET DISCHARGE HEAD AND INKJET RECORDING DEVICE USING THE PIEZOELECTRIC THIN FILM ELEMENT

(71) Applicants: Masahiro Ishimori, Inagi (JP); Masaru Shinkai, Yokohama (JP); Satoshi Mizukami, Sagamihara (JP)

(72) Inventors: Masahiro Ishimori, Inagi (JP); Masaru Shinkai, Yokohama (JP); Satoshi Mizukami, Sagamihara (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/835,987

(22) Filed: Mar. 15, 2013

(65) Prior Publication Data

US 2013/0250007 A1    Sep. 26, 2013

(30) Foreign Application Priority Data

Mar. 22, 2012  (JP) ................................ 2012-066087

(51) Int. Cl.
| | |
|---|---|
| B41J 2/045 | (2006.01) |
| H01L 41/047 | (2006.01) |
| H01L 41/314 | (2013.01) |
| H01L 41/09 | (2006.01) |
| H01L 41/29 | (2013.01) |
| H01L 41/318 | (2013.01) |
| B41J 2/14 | (2006.01) |
| B41J 2/16 | (2006.01) |

(52) U.S. Cl.
CPC ............ *H01L 41/0477* (2013.01); *B41J 2/045* (2013.01); *H01L 41/314* (2013.01); *H01L 41/0973* (2013.01); *H01L 41/0478* (2013.01); *H01L 41/29* (2013.01); *H01L 41/318* (2013.01); *B41J 2/14233* (2013.01); *B41J 2/161* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *B41J 2002/14241* (2013.01); *B41J 2202/03* (2013.01)
USPC ........................................................ 347/68

(58) Field of Classification Search
None
See application file for complete search history.

(56) References Cited

U.S. PATENT DOCUMENTS

| | | | |
|---|---|---|---|
| 6,096,434 A | 8/2000 | Yano et al. | |
| 6,097,133 A | 8/2000 | Shimada et al. | |
| 6,194,228 B1 | 2/2001 | Fujiki et al. | |
| 6,294,860 B1 | 9/2001 | Shimada et al. | |
| 6,351,006 B1 | 2/2002 | Yamakawa et al. | |
| 6,387,225 B1 | 5/2002 | Shimada et al. | |
| 6,398,349 B1 * | 6/2002 | Murai | 347/68 |
| 2005/0018019 A1 * | 1/2005 | Miyazawa et al. | 347/68 |
| 2005/0168112 A1 * | 8/2005 | Aoki et al. | 310/358 |

(Continued)

FOREIGN PATENT DOCUMENTS

| | | |
|---|---|---|
| JP | 11-195768 | 7/1999 |
| JP | 2000-252544 | 9/2000 |

(Continued)

*Primary Examiner* — Matthew Luu
*Assistant Examiner* — Erica Lin
(74) *Attorney, Agent, or Firm* — Cooper & Dunham LLP

(57) ABSTRACT

A piezoelectric thin film element includes a vibration plate, a lower electrode provided on the vibration plate and made of a conductive oxide, a piezoelectric thin film provided on the lower electrode and made of a polycrystalline substance, and an upper electrode provided on the piezoelectric thin film, wherein the lower electrode includes a titanium oxide film formed on the vibration plate, a platinum film formed on the titanium oxide film, and a conductive oxide film formed on the platinum film and, the platinum film and the conductive oxide film being a solid film with no holes.

12 Claims, 9 Drawing Sheets

(56) References Cited

U.S. PATENT DOCUMENTS

| | | | |
|---|---|---|---|
| 2011/0228015 A1* | 9/2011 | Ohashi | 347/71 |
| 2012/0056945 A1* | 3/2012 | Nakayama | 347/68 |

FOREIGN PATENT DOCUMENTS

| | | |
|---|---|---|
| JP | 3249496 | 11/2001 |
| JP | 2003-218325 | 7/2003 |
| JP | 3472087 | 9/2003 |
| JP | 2004-186646 | 7/2004 |
| JP | 2004-262253 | 9/2004 |
| JP | 2007-258389 | 10/2007 |
| JP | 2008-010880 | 1/2008 |
| JP | 4572346 | 8/2010 |

* cited by examiner

SURFACE

CROSS SECTION

SURFACE

CROSS SECTION

PIEZOELECTRIC THIN FILM ELEMENT AND METHOD OF MANUFACTURING THE SAME, DROPLET DISCHARGE HEAD AND INKJET RECORDING DEVICE USING THE PIEZOELECTRIC THIN FILM ELEMENT

PRIORITY CLAIM

The present application is based on and claims priority from Japanese Patent Application No. 2012-066087, filed on Mar. 22, 2012, the disclosure of which is hereby incorporated by reference in its entirety.

BACKGROUND

1. Field of the Invention

The present disclosure relates to a piezoelectric thin film element for use in an inkjet recording head or the like, and a method of manufacturing the piezoelectric thin film element, and to a droplet discharge head and an inkjet recording device using the piezoelectric thin film element.

2. Description of the Related Art

Some of conventional image recording devices and imaging devices such as a printer, a facsimile, and a copy machine use an inkjet recording device equipped with an inkjet recording head as a liquid discharge head (liquid ejection head). Two types of inkjet recording heads (ink ejection heads) are practically used: one uses a longitudinal vibration mode piezoelectric actuator which extends and contracts in the axial direction of a piezoelectric film (hereinafter referred to as a piezoelectric material or a piezoelectric thin film as needed), and the other uses a flexural vibration mode piezoelectric actuator.

An inkjet recording head using the longitudinal vibration mode piezoelectric actuator has a piezoelectric element (piezoelectric thin film element) in which an electromechanical conversion element is stacked on a vibration plate. The electromechanical conversion element has a longitudinal vibration mode piezoelectric film (piezoelectric material) extending and contracting (expanding and contracting) in the axial direction (longitudinal direction), and electrodes between which the piezoelectric film (piezoelectric material) are held in a vertical direction. The inkjet recording head is configured to eject droplets of an ink in a compression cavity through nozzles by applying pressure by expansion and contraction of the piezoelectric film to the ink in the compression cavity.

On the other hand, in a known inkjet recording head using the flexural vibration mode actuator, for example, piezoelectric elements are formed independently in respective pressure generation cavities in such a way that a uniform piezoelectric film is formed as a piezoelectric material layer over the entire surface of a vibration plate by film formation technology, and the piezoelectric material layer is cut into shapes corresponding to the pressure generation cavities by the lithography technique.

Japanese Patent Application Publication No. 2004-186646 discloses a technique of enabling formation of a piezoelectric film having superior crystal orientation by forming a piezoelectric film on a titanium-containing noble metal electrode on the surface of which titanium is deposited in island shapes. Japanese Patent Application Publication No. 2004-262253 discloses a technique of enabling formation of a piezoelectric film having superior crystal orientation by using a MgO substrate as a substrate. Furthermore, Japanese Patent Application Publication No. 2003-218325 discloses a method of manufacturing a ferroelectric film as a piezoelectric film, by forming an amorphous ferroelectric film, and thereafter crystallizing the film by rapid heating method, Japanese Patent Application Publication No. 2007-258389 discloses a method of manufacturing a piezoelectric film which includes a perovskite-type complex oxide (may also contain unavoidable impurities) having a crystal structure of one of tetragonal system, orthorhombic system, and rhombohedral system, and is has a preferred orientation with any one of (100) plane, (001) plane, and (111) plane at a degree of orientation of 95% or higher in the above film formation process.

In most of the piezoelectric films in the above-mentioned Japanese Patent Application Publications, a PZT film is produced on platinum. A metal material such as Pt, Ir, Ru, Ti, Ta, Rh, or Pd has been used as an electrode material conventionally. Among them, platinum is generally used. The reason for the frequent use of platinum is that platinum has a high self-orientation due to its face-centered cubic lattice (FCC) structure which is a close-packing structure; and even when a platinum film is formed on an amorphous material such as $SiO_2$ which is a material of the vibration plate, the platinum film is highly oriented with the (111), and the piezoelectric film on the platinum film also has a favorable orientation.

However, columnar crystal grains grow due to a high orientation, and thus there is a problem in that an element such as Pb is likely to diffuse to the base electrode along grain boundaries.

In addition, in the conventional technology, a possibility has been pointed out that oxygen deficiency in the piezoelectric thin film (piezoelectric film, piezoelectric material) may increase over time during the operation of the piezoelectric thin film (piezoelectric film, piezoelectric material). A conductive oxide electrode is used today as the supply source for the deficient oxygen.

In order to form the piezoelectric thin film, a conductive oxide electrode immediately below the piezoelectric thin film plays a key role. Among all, $SrRuO_3$ (strontium ruthenate) has the same perovskite-type crystal structure as PZT. Thus, $SrRuO_3$ has good bondability at the interface, allows easy epitaxial growth of PZT, and provides excellent characteristics of Pb diffusion barrier layer (for example, see Japanese Patent No. 3249496, Japanese Patent No. 3472087, and Japanese Patent Application Publication No. Hei 11-195768).

A lower electrode provided on the above-described vibration plate has been formed by using a stacked structure in which titanium, platinum, and conductive oxide $SrRuO_3$ films are formed in this order on the vibration plate. The reason why the titanium film is used is to improve adhesion between the vibration plate and the lower electrode. Observation with a scanning electron microscope has revealed that when the titanium film is used as an adhesion layer, minute holes each having a dimension of 100 nm or less are generated in the lower electrode film and on the surface of the lower electrode after the formation of the $SrRuO_3$ film. This is because titanium diffuses into the platinum film when the $SrRuO_3$ film is formed at a high temperature, and thus holes are formed in the platinum film by the diffusion.

Such a $SrRuO_3$ film is generally formed by sputtering method. The formation of a $SrRuO_3$ film having a favorable crystalline state and highly oriented with the (111) plane by the sputtering method requires a film formation at a high temperate of 450 to 650° C. Thus, after the temperature is increased to 450 to 650° C., the $SrRuO_3$ film is formed by sputtering method.

However, with the sputtering method, when the temperature is increased to 450 to 650° C. before the formation of the $SrRuO_3$ film, titanium diffuses into the platinum film, and holes are formed in the platinum film as described above.

When holes are formed in the platinum film in this manner, the continuity of a conductive oxide crystal is blocked due to the holes, and thus it is difficult to form the conductive oxide $SrRuO_3$ film having an average particle diameter greater than that of the platinum film. In this case, the crystalline state of the conductive oxide crystal affects the quality of the piezoelectric thin film (piezoelectric material) which is formed immediately above the conductive oxide crystal.

Therefore, what are necessary to further improve the characteristics of the piezoelectric element (piezoelectric thin film element) having the piezoelectric thin film are to increase the size of the crystal grains of the conductive oxide $SrRuO_3$ film and to achieve favorable crystalline state.

On the other hand, when the conductive oxide $SrRuO_3$ film has a small average particle diameter, and has a high surface roughness of the conductive oxide, the conductive oxide $SrRuO_3$ has more grain boundaries. As the number of grain boundaries of the conductive oxide $SrRuO_3$ increases, a leak current increases. In addition, the holes in a conductive oxide $SrRuO_3$ with a high surface roughness cause electric field concentration, thereby reducing the breakdown voltage of the piezoelectric element in which a piezoelectric thin film is interposed between a pair of electrodes.

In addition, since holes are generated in the platinum film, a lead component in the PZT film is excessively trapped in the holes in the surface of the lower electrode and in the holes in the platinum. Therefore, in the vicinity of the lower electrode, the lead component in sol gel liquid needs to exceed the required amount according to stoichiometry by 20 mol %.

In the above piezoelectric element, the excessive diffusion of Pb into the lower electrode causes the formation of a leak path and the concentration of electric field, thereby reducing the breakdown voltage of the piezoelectric element. In addition, an inkjet recording head (ink ejection head) using the piezoelectric element as the piezoelectric actuator causes reduction in the speed of droplet.

In order to eliminate the above-described problems, the holes in the surface of the lower electrode may be removed by increasing the thickness of the platinum film. However, an increase in the thickness of the platinum electrode made of an expensive metal causes an increase in cost, and thus is not desirable.

Instead, in order to eliminate the above-described problems, the amount of titanium that diffuses into the platinum film may be reduced by decreasing the thickness of the titanium film. However, extremely reduced thickness of the titanium film leads to decrease in the adhesion of the titanium film, and may cause the lower electrode to come off.

SUMMARY

Thus, the present disclosure provides a piezoelectric thin film element, a method of manufacturing the piezoelectric thin film element, and a droplet discharge head and an inkjet recording device which use the piezoelectric thin film element. Specifically, an electromechanical conversion element having a piezoelectric thin film (piezoelectric material) interposed between electrodes is provided on a vibration plate with a lower electrode stacked on the vibration plate by using a titanium oxide film as an adhesion layer. This leads to achievement of a solid columnar-grain film with no holes in the lower electrode, and improvement of the crystalline state of a conductive oxide of the lower electrode.

In order to achieve the above piezoelectric thin film element, an aspect of the present disclosure provides a piezoelectric thin film element including: a vibration plate; a lower electrode provided on the vibration plate and made of a conductive oxide; a piezoelectric thin film provided on the lower electrode and made of a polycrystalline substance; and an upper electrode provided on the piezoelectric thin film. The lower electrode includes a titanium oxide film formed on the vibration plate; a platinum film formed on the titanium oxide film; and a conductive oxide film formed on the platinum film, the platinum film and the conductive oxide film being a solid film with no holes.

BRIEF DESCRIPTION OF THE DRAWINGS

The accompanying drawings are included to provide further understanding of the disclosure, and are incorporated in and constitute a part of this specification. The drawings illustrate embodiments of the present disclosure and, together with the specification, serve to explain the principle of the present disclosure.

DETAILED DESCRIPTION OF THE PREFERRED EMBODIMENTS

Hereinafter, an embodiment of a piezoelectric thin film element, a method of manufacturing the piezoelectric thin film element, a droplet discharge head and an inkjet recording device using the piezoelectric thin film element according to the present disclosure will be described with reference to the drawings.

Embodiment 1

Figure 1:
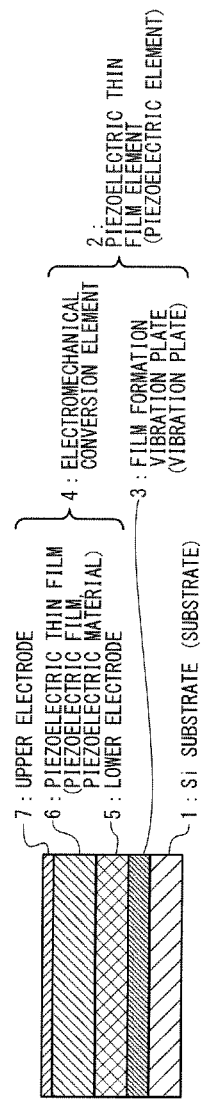
FIG. 1 is a schematic cross-sectional view of a piezoelectric thin film element according to Embodiment 1 of the present disclosure.
Figure 2:
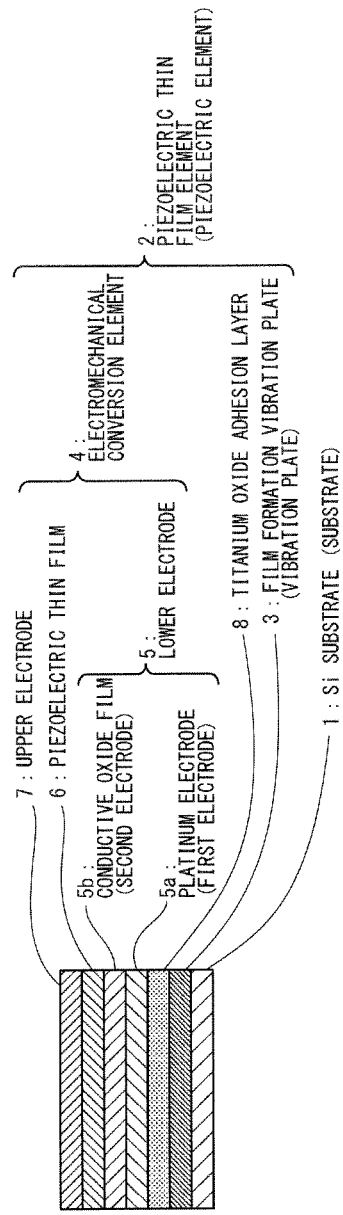
FIG. 2 is a more detailed cross-sectional view of the piezoelectric thin film element of FIG. 1.

FIG. 1 illustrates a schematic configuration of the piezoelectric thin film element (piezoelectric element) according to the present disclosure; and FIG. 2 illustrates a more detailed configuration of the piezoelectric thin film element illustrated in FIG. 1.

The piezoelectric thin film element (piezoelectric actuator) illustrated in FIG. 1 includes a substrate 1, and a piezoelectric thin film element (piezoelectric element) 2 provided on the substrate 1. The piezoelectric thin film element (piezoelectric element) 2 includes a film formation vibration plate 3 provided (stacked) on the substrate 1, and an electromechanical conversion element provided (stacked) on the film formation vibration plate 3. The electromechanical conversion element has a lower electrode 5 provided (stacked) on the film formation vibration plate 3, a piezoelectric thin film (hereinafter referred to as a piezoelectric material or a piezoelectric film as needed) 6, and an upper electrode 7 provided (stacked) on the piezoelectric thin film 6.

<More Detailed Configuration of Piezoelectric Thin Film Element 2 and Method of Manufacturing the Same>

[Configuration]

As illustrated in FIG. 2, the piezoelectric thin film element (piezoelectric actuator) includes the substrate 1 in FIG. 1, and the piezoelectric thin film element (piezoelectric element) 2 provided on the substrate 1. The lower electrode 5 of the piezoelectric thin film element has a platinum electrode 5a (a platinum electrode thin film which is a platinum electrode layer, i.e., a platinum film) which is a first metal electrode, and a conductive oxide film 5b which is a second electrode provided (stacked) on the platinum electrode 5a as illustrated in FIG. 2. The platinum electrode 5a is provided (stacked) on the film formation vibration plate 3 with a titanium oxide adhesion layer (titanium oxide film) 8 interposed therebetween. UM ox

[Manufacturing Method]

A method of manufacturing the piezoelectric thin film element (piezoelectric element) 2 will be described with reference to FIG. 2 in the following.

First, using a Si substrate composed of Si for substrate 1, the surface of the substrate 1 was thermally oxidized, thereby forming an $SiO_2$ insulating film on the substrate 1. The $SiO_2$ film serves as the film formation vibration plate 3 where the thickness of the $SiO_2$ film is 2 μm. A titanium film (having a thickness of 50 nm) was formed on the $SiO_2$ film by sputtering for film formation, and subsequently, the titanium film is thermally oxidized in $O_2$ atmosphere at 700° C. for five minutes using a RTA (Rapid Thermal Annealing) device), thereby forming the titanium oxide adhesion layer 8 made of a titanium oxide film on the film formation vibration plate 3. On the titanium oxide adhesion layer 8, the platinum electrode 5a which serves as the lower electrode 5 was formed by sputtering for film formation with a platinum film (having a thickness of 125 nm).

Subsequently, a conductive oxide film 5b was formed on the platinum electrode 5a by sputtering for film formation of SRO film i.e., a SrRuO film (having a thickness of 50 nm). The sputtering for film formation was performed at a substrate heating temperature of 550° C.

Subsequently, a solution, which serves as the piezoelectric thin film 6, was prepared by mixing Pb, Zr, and titanium with a composition ratio of 110:53:47. Specifically, for the composition of the precursor coating liquid for the solution, lead acetate trihydrate, titanium isopropoxide, and zirconium isopropoxide were used. The crystallization water of the lead acetate was dissolved in methoxyethanol, and then dehydrated. The amount of lead was excessively given with respect to the stoichiometric composition. This is because to prevent reduction in the crystalline state due to so-called lead loss during heat treatment.

Titanium isopropoxide and zirconium isopropoxide were dissolved in methoxyethanol, alcohol exchange reaction and esterification reaction proceeded, and the resulting solution was mixed with methoxyethanol solution in which the aforementioned lead acetate was dissolved, thereby forming PZT precursor solution. The PZT concentration 0.5 was mol/liter. A film was formed by spin coating using the liquid, and then was dried at 120° C. and thermally decomposed at 500° C. After a third layer was thermally decomposed, crystallization heat treatment (at a temperature of 750° C.) was performed by RTA (Rapid Thermal Annealing). The thickness of PZT was 240 nm then. The above process was repeated eight times in total (24 layers) so as to form a PZT film having a thickness of 2 μm.

Subsequently, an SRO film i.e., an SrRuO film (having a thickness of 40 nm) which serves as the upper electrode 7 was formed by sputtering for film formation. The sputtering for film formation was performed at a substrate temperature of 300° C. Subsequently, post-anneal treatment at 550° C./300 s was performed in oxygen atmosphere by RTA treatment.

By the above-described manufacturing method, the piezoelectric thin film element (piezoelectric element) illustrated in FIG. 2 was formed. The piezoelectric thin film element (piezoelectric element) has a configuration in which the substrate 1, the film formation vibration plate 3, the titanium oxide adhesion layer 8, the platinum electrode 5a, the conductive oxide film 5b, the piezoelectric thin film 6, and the upper electrode 7 are stacked in this order.

Embodiment 2

Figure 3:
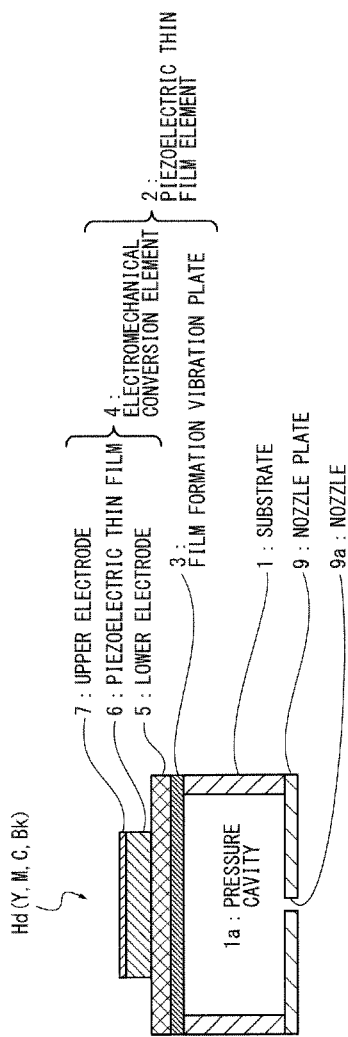
FIG. 3 is a schematic cross-sectional view of a inkjet recording head (droplet discharge head) in Embodiment 2, the inkjet recording head having the piezoelectric thin film element in Embodiment 1 illustrated in FIGS. 1 and 2 as a piezoelectric actuator.

FIG. 3 illustrates a schematic configuration of the inkjet recording head (droplet ejection head) Hd having the piezoelectric actuator in FIG. 1.

The inkjet recording head Hd in FIG. 3 uses the piezoelectric actuator which has the configuration illustrated in FIGS. 1 and 2. In the inkjet recording head Hd in FIG. 3, the substrate 1 is provided with a pressure cavity (compression cavity) 1a which is open at upper and lower ends. A nozzle plate 9 is then installed at the lower end of the substrate 1 so as to close the lower open end of the pressure cavity 1a, and a nozzle 9a which communicates with the pressure cavity 1a to eject the ink in the pressure cavity 1a is provided in the nozzle plate 9. In addition, the upper open end of the pressure cavity 1a is closed by the film formation vibration plate 3.

It is to be noted that more specific materials and manufacturing process for the substrate 1 and the piezoelectric thin film element 2 in FIGS. 1 and 2 are the same as those of the inkjet recording head Hd in FIG. 3 described below. The manufacturing process of the inkjet recording head Hd in FIG. 3 will be described in the following.

A Si substrate used as the substrate 1 is preferably a single crystal silicon substrate, and preferably has a thickness of 100 to 650 μm normally. When the pressure cavity La as illustrated in FIG. 3 is produced, the substrate 1, in which a single crystal silicon substrate is used, is processed by etching. An etching method to be used in this case is the anisotropic etching.

When the piezoelectric thin film element (piezoelectric element) is applied to the inkjet recording head (droplet ejection head) in Embodiment 2 in FIG. 3, the pressure cavity 1a is formed in the substrate 1. In this case, the film formation vibration plate (vibration plate) 3 preferably has a predetermined strength because the film formation vibration plate (base plate) 3 receives a force generated by the piezoelectric thin film 6 so as to be deformed and displaced, thereby discharging droplets of ink in the pressure cavity 1a in FIG. 3 which is formed in the substrate 1.

The material for the film formation vibration plate (base plate) 3 includes Si, $SiO_2$, $Si_3N_4$ which are used by CVD method. In addition, the material of the film formation vibration plate (base plate) 3 is preferably selected from materials which have coefficients close to the coefficients of linear expansion of the lower electrode 5, the piezoelectric thin film 6 as illustrated in FIG. 1. Particularly, PZT is generally used as the material for the piezoelectric thin film 6, and thus a material having the coefficient of linear expansion of $5 \times 10^{-6}$ to $10 \times 10^{-6}$, which is close to the coefficient of linear expansion of $8 \times 10^{-6} (1/K)$, is preferable, and a material having the coefficient of linear expansion of $7 \times 10^{-6}$ to $9 \times 10^{-6}$ is further preferable. Specifically, the material includes aluminum oxide, zirconium oxide, Iridium oxide, ruthenium oxide, tantalum oxide, hafnium oxide, osmium oxide, rhenium oxide, rhodium oxide, palladium oxide, and their compounds, and these can be produced with a spin coater by sputtering method or the Sol-Gel method. The film preferably has a thickness of 0.1 to 10 μm, and further preferably has a thickness of 0.5 to 3 μm. With a range of film thickness narrower than the above-mentioned ranges, processing of the pressure cavity 1a as illustrated in FIG. 3 is difficult, whereas with a wider range of the film thickness, the base plate is not likely to be deformed or displaced, and thus discharge of the ink droplet is unstable.

Subsequently, a titanium film having a thickness of 5 to 100 nm is first formed on the film formation vibration plate (vibration plate) 3 by sputtering method, and then the lower electrode 5 of the piezoelectric thin film element is formed.

Subsequently, the titanium film is thermally oxidized in $O_2$ atmosphere for 1 to 30 minutes at a temperature of 650 to 800° C. using a RTA (Rapid Thermal Annealing) device, so that the titanium film is converted to a titanium oxide film, and thus the titanium oxide adhesion layer 8 made of a titanium oxide film is formed on the film formation vibration plate (vibration plate) 3.

In order to produce the titanium oxide film, a thermal oxidation method at a high temperature is preferably used for the titanium film. However, reactive sputtering may be used. In order to produce the titanium oxide film by reactive sputtering, a specific sputtering chamber configuration is needed because a Si (silicon) substrate needs to be heated to a high temperature. In addition, the crystalline state of the titanium $O_2$ film (titanium oxide film) achieved by oxidation with a RTA device is more favorable than the crystalline state achieved by oxidation with a typical furnace. This is because a titanium film which is likely to be oxidized forms several crystal structures at a low temperature when oxidation is achieved by a normal heating furnace, and thus the formed crystal structures need to be destroyed. Consequently, oxidation by a RTA device with a high temperature increase rate is advantageous in forming high quality crystal.

Subsequently, part of a platinum film which is the lower electrode 5 having a thickness of 150 nm or less is formed as the platinum electrode 5a on the titanium oxide adhesion layer 8, a titanium $O_2$ film by sputtering method. Subsequently, $SrRuO_3$ is formed as the conductive oxide film 5b on the platinum film which serves as the platinum electrode 5a, by sputtering method.

Although the properties of an SRO ($SrRuO_3$) thin film (hereinafter simply referred to as an SRO) vary depending on sputtering conditions, in order to achieve (111) orientation of the $SrRuO_3$ film similarly to the (111) orientation of the platinum electrode with particular emphasis on the crystal orientation, film formation is preferably made by heating the substrate at a temperature of 450 to 600° C. The conditions for forming the $SrRuO_3$ thin film, i.e., the SRO film may be such that the SRO film is formed at the room temperature, and then thermally oxidized at a crystallization temperature (650° C.) by RTA processing. In this case, the SRO film is sufficiently crystallized, and a sufficient value of the conductivity of the electrode is obtained, the crystal preferred orientation of the SRO film is more likely to be (110) orientation, and PZT formed on the SRO film is also likely to have the (110) orientation.

The crystalline state of SRO formed on the (111) orientation of the platinum electrode 5a is difficult to judge because the lattice constants of the platinum electrode 5a and SRO are close to each other, and thus 2θ positions of SRO (111) orientation and platinum (111) orientation are overlapped under a normal θ-2θ measurement. In the platinum electrode 5a, diffraction lines are cancelled each other at a position where 2θ is approximately 32° with Psi inclined by 35° because of a relationship of elimination rule, and thus diffraction strength is not observed. Therefore, determination is made according to a peak diffraction strength at a position where Psi direction is inclined by approximately 35° and 2θ is approximately 32°, and thus whether the SRO has preferred-(111)orientation can be confirmed.

The SRO film may be formed with a total thickness of 50 to 400 nm for the adhesion layer, the electrode layer, and the oxide electrode layer altogether.

For the piezoelectric thin film (piezoelectric material) 6, lead zirconate titanate (hereinafter referred to as a PZT) having Zr:titanium ratio of 52:48 is usually often used, and has favorable piezoelectric performance and stable characteristic, and thus is used as the mainstream material. The lead zirconate titanate is used as an oxide including lead, zirconium, and titanium as constituent elements with various ratios without being limited to the above composition ratio, and the oxide is mixed with an additive or partially replaced with an additive. Other known material type includes a perovskite-type oxide expressed by general chemical formula $ABO_3$ (A includes Pb, and B includes Zr and titanium) which is preferably used, and lead zirconate titanate niobate (PZTN) in which Nb is used. Furthermore, in view of environmental protection, the following may be used: Ba titanium $O_3$ (barium titanate, BT) without Pb, a complex oxide (BST) of barium, strontium, and titanium, and a complex oxide (SBT) of strontium, bismuth, and tantalum.

It is to be noted that Sol-Gel method, e spin coating method with sol-gel liquid is used as the manufacturing process of the above-described piezoelectric thin film (piezoelectric material) 6. In an example of PZT, the lower electrode film (film of the lower electrode 5) is coated with a solution, in which an organometallic compound containing each of Pb, Zr and titanium is dissolved in a solvent, and subsequently, calcination process for solidifying the coated piezoelectric film, and calcination process for crystallizing the piezoelectric film are performed, and thus piezoelectric layer is formed as the piezoelectric thin film 6. The calcination process for solidification is usually performed for each coated layer. The calcination process for crystallizing the piezoelectric layer is performed for several solidified and calcinated layers altogether. The solidification process is performed for M times, the calcination process for crystallization is performed for N times, and a series of processes are repeated, thereby providing a piezoelectric layer having a desired thickness. The temperature in drying process is in a range of 350 to 550° C., and the temperature in crystallization heat treatment process is in a range of 650 to 800° C. When a RTA is used, heating time is in a range of several tens seconds to several minutes. The thickness of the piezoelectric layer may be, for example, in a range of several tens nm to several μm.

The upper electrode layer (the upper electrode 7) is formed at the top layer of the piezoelectric layer (piezoelectric thin film 6). The material for the upper electrode layer (the upper electrode 7) may be the same as the material for the lower electrode layer (the lower electrode 5). Unlike the lower electrode material layer, the upper electrode 7 has a wider selection of materials than with the lower electrode 5 because a high heat process performed during the formation of the piezoelectric layer (the piezoelectric thin film 6) is not present in the subsequent processes, and lattice constant matching with the piezoelectric material (piezoelectric thin film 6) is not necessary. However, in the conventional technology, a possibility has been pointed out that oxygen deficiency in the piezoelectric material (the piezoelectric thin film 6) may increase over time during the operation of the piezoelectric material (the piezoelectric thin film 6), and thus a conductive oxide electrode is used today as the supply source for the deficient oxygen. That is to say, the oxide electrode layer (the conductive oxide film 5b), which has been described in the paragraph of the lower electrode (the lower electrode 5) is used today at the contact interface with dielectric materials. Thus, the material types specifically used are the same as those of the lower electrode 5, and $IrO_2$, $LaNiO_3$, $RuO_2$, SrO, $SrRuO_3$, $CaRuO_3$, and the like are used as the oxide electrode layer (conductive oxide film 5b).

The formation process of the upper electrode 7 usually adopts a sputtering formation method. In addition, a well-known method such as vacuum deposition method or CVD (Chemical Vapor Deposition) method may be performed. The film of the upper electrode 7 may be formed with a total thickness of 50 to 300 nm for the oxide electrode layer and the electrode layer together.

Usually, after the formation of the lower electrode 5, the piezoelectric thin film 6, i.e., the piezoelectric layer element is formed, and the upper electrode 7 is formed on the piezoelectric layer element. The element (the piezoelectric thin film 6) is usually formed in the following manner: a mask layer for etching is formed on the lower electrode 5 by patterning a photoresist, and then the element is formed on the lower electrode 5 by dry or wet etching.

The patterning of the photoresist on the lower electrode 5 may be performed by a well-known photolithography technique. That is to say, the patterning may be performed in the following manner: a photoresist is applied onto the surface of the lower electrode 5 by a spin coater or a roll coater, subsequently, the surface is exposed to UV rays with a glass photomask having a desired pattern formed, then pattern development, rinsing, and drying, are followed, and consequently a photoresist mask layer is formed on the lower electrode 5.

Since an inclination at the end of the pattern of the photoresist mask layer affects the inclined cross-section at the time of etching, the photoresist mask layer should selected in consideration of a resist selection ratio (the ratio of etching rates of a material to be etched and a mask material) according to a desired inclined angle. After the etching, a remaining photoresist on the lower electrode film can be removed from the lower electrode 5 using a stripping solution for exclusive use or oxygen plasma ashing.

Dry etching, which uses a reactive gas as an etching gas, is selected for the etching for the sake of form stability. The etching gas may be a halogen-based gas such as chlorine-based or fluorine-based gas, or a mixture of a halogen-based gas and Ar or oxygen.

In the above step, the etching gas or etching conditions may be changed, so that the upper electrode 7 can be etched continuously after the piezoelectric layer (piezoelectric thin film 6) is etched. Optionally, etching may be performed in several steps with a new resist pattern in each step. The upper electrode 7 may be formed on the piezoelectric layer (piezoelectric thin film 6) after the formation of the piezoelectric layer (piezoelectric thin film 6), so that the process order allows the upper electrode 7 to be formed on the piezoelectric thin film 6 continuously.

Comparative Example 1

In contrast to the piezoelectric thin film element 2 in Embodiment 1 (Embodiment 2), in which SRO ($SrRuO_3$) film is formed in the lower electrode 5 as described above, a piezoelectric thin film element, in which SRO ($SrRuO_3$) film is not formed in the lower electrode 5, was produced as Comparative Example 1, so that particle diameters, presence/absence of hole, breakdown voltages in Embodiment 1 (Embodiment 2) and Comparative Example 1 were measured and compared to each other as described below. The results of the comparison of the measurement will be described in the following.

As illustrated in Table 1, for the piezoelectric thin film elements produced in Embodiment 1 and Comparative Example 1, particle diameters were evaluated using Nano-Scope IIIaAFM manufactured by Veeco Instruments Inc. in Japan immediately after a platinum film was formed as the lower electrode, and immediately after a $SrRuO_3$ film was formed in the manufacturing (production) process of each piezoelectric thin film element. That is to say, in Comparative Example 1, the film composition of AFM and particle diameters (nm) in the film composition were evaluated.

In Comparative Example 1, a titanium film was formed by sputtering, and the piezoelectric thin film element was manufactured similarly to Embodiment 1 except that RTA processing was not performed after the formation of the titanium film. In the AFM measurement, the measurement mode was tapping mode, the measurement range was 3 mm×3 mm, and the scanning speed was 1 Hz. Table 1 summarizes the details results.

TABLE 1

|  | AFM MEASUREMENT FILM COMPOSITION | PARTICLE DIAMETER (nm) |
|---|---|---|
| COMPARATIVE EXAMPLE 1 | Pt/Ti | 80 to 70 |
|  | SRO/Pt/Ti | 80 to 70 |
| EMBODIMENT I | PT/$TiO_2$ | 100 to 80 |
|  | SRO/Pt/$TiO_2$ | 120 to 170 |

In Comparative Example 1, as illustrated in Table 1, the film composition of AFM in Embodiment 1 was platinum electrode 5a/titanium oxide adhesion layer 8, in other words, the film composition of platinum electrode 5a and titanium oxide adhesion layer 8 was Pt/TiO$_2$, and conductive oxide film 5b/platinum electrode 5a/titanium oxide adhesion layer 8 each including SRO, in other word, the film composition of conductive oxide film 5b, platinum electrode 5a, and titanium oxide adhesion layer 8 each including SRO was SRO/Pt/ TiO$_2$. On the other hand, the film composition of AFM in Comparative Example 1 was platinum electrode 5a/titanium layer, in other words, the film composition of platinum electrode 5a and titanium layer was Pt/Ti, and conductive oxide film 5b/platinum electrode 5a/titanium layer each including SRO, in other words, the film composition of conductive oxide film 5b, platinum electrode 5a, and titanium layer each including SRO was SRO/Pt/Ti.

As illustrated in Table 1, in Embodiment 1, the particle diameter in the film composition of Pt/TiO$_2$ was 100 to 80 nm, and the particle diameter in the film composition of SRO/Pt/TiO$_2$ was 120 to 170 nm. On the other hand, in Comparative Example 1, the particle diameter in the film composition of Pt/Ti was 80 to 70 nm, and the particle diameter in the film composition of SRO/Pt/Ti was 80 to 70 nm.

In Embodiment 1 and Comparative Example 1, immediately after an SRO (SrRuO$_3$) film was formed as the lower electrode, the surface of the SrRuO$_3$ film was observed by a scanning electron microscope, i.e., SEM (hereinafter simply referred to as SEM observation). In addition, the SrRuO$_3$ film was microscopically processed on a cross-section (microscopic cross-section processing) by a Focused Ion Beam, i.e., FIB, and the cross-section of the SrRuO$_3$ film was observed by a SEM.

Figure 4A:
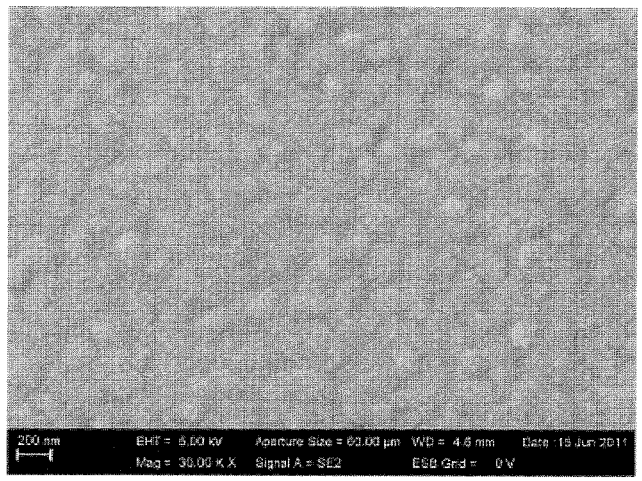
FIG. 4A is a SEM image of the surface of an $SrRuO_3$ film in Embodiment 1.
Figure 4B:
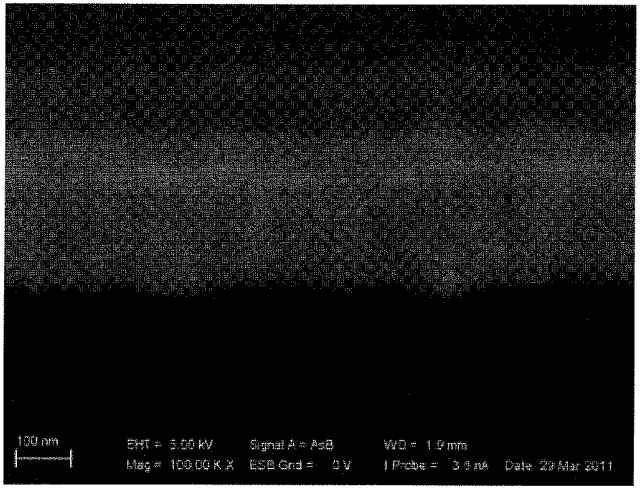
FIG. 4B is a SEM image of a cross-section of the $SrRuO_3$ film in Embodiment 1.
Figure 5A:
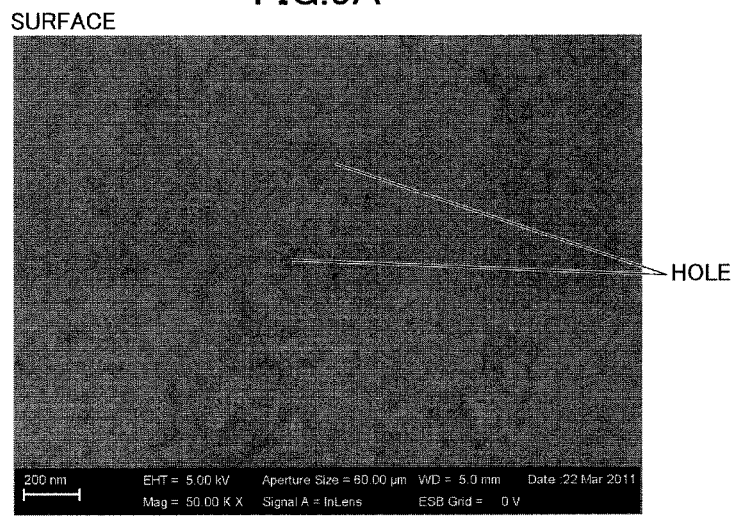
FIG. 5A is a SEM image of the surface of an $SrRuO_3$ film in Comparative Example 1.
Figure 5B:
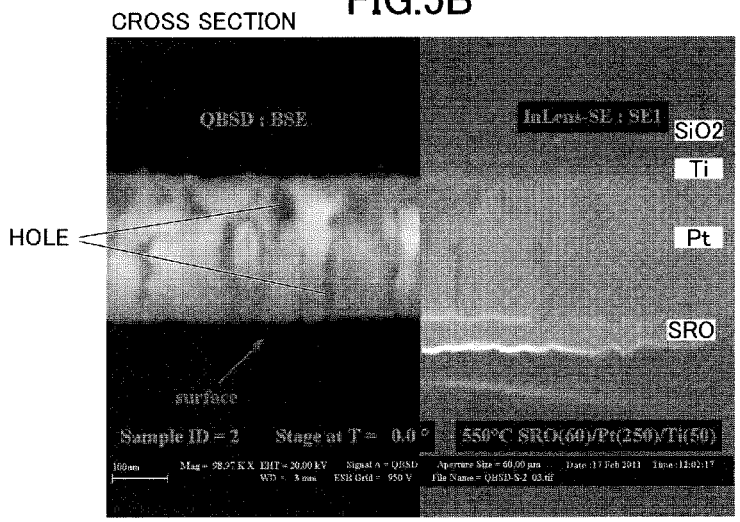
FIG. 5B is a SEM image of a cross-section of the $SrRuO_3$ film in Comparative Example 1.

FIG. 4A illustrates a SEM image of the surface of the SrRuO$_3$ film in Embodiment 1; and FIG. 4B illustrates a SEM image of a cross-section of the SrRuO$_3$ film in Embodiment 1. On the other hand, FIG. 5A illustrates a SEM image of the surface of the SrRuO$_3$ film in Comparative Example 1; and FIG. 5B illustrates a SEM image of a cross-section of the SrRuO$_3$ film in Comparative Example 1. For the observation of a cross-section of the SrRuO$_3$ film for checking holes, the magnification of the SEM was set to 100 k or greater.

As seen from the observation examples, no hole was observed in Embodiment 1 as illustrated in FIGS. 4A and 4B. However, in Comparative Example 1, a great number of holes were observed on a platinum electrode (Pt) as well as on the surface of an SRO as illustrated in FIGS. 5A and 5B. In the SEM observation, the particle diameters of platinum and SRO were evaluated, which agree with the results of Table 1.

In the film composition of the piezoelectric thin film element produced in Embodiment 1 and Comparative Example 1 as in Table 1, respective breakdown voltages (V), residual polarizations (Pr), piezoelectric constants d31 (pm/V), deterioration rates (%) of droplet speed (droplet ejection speed) as in Table 2 were compared to each other. For the piezoelectric thin film in the comparison, deformation due to electric field application (150 kV/cm) was measured by a laser Doppler vibrometer, and calculated from calibration by simulation. After the initial characteristics were evaluated, durability (the characteristics immediately after repeated application of voltage $10^{10}$ times) was evaluated. Table 2 summarizes the details results.

TABLE 2

| | BREAKDOWN VOLTAGE (V) | 2Pr (μC/cm$^2$) | | d31 (pm/V) | | DETERIORATION RATE OF DROPLET SPEED (%) |
| --- | --- | --- | --- | --- | --- | --- |
| | | INITIAL | AFTER $10^{10}$ Times | INITIAL | AFTER $10^{10}$ Times | |
| EMBODIMENT 1 | 214 | 48 | 46 | −158 | −156 | 2.8 |
| COMPARATIVE EXAMPLE 1 | 111 | 44 | 36 | −152 | −136 | 10.2 |

As seen from Table 2, in Embodiment 1, the initial characteristics and the result after the durability experiment were comparable to the characteristics of a typical ceramic sintered body. That is to say, in Embodiment 1, the breakdown voltage was 214V, the residual polarization Pr was 45 to 50 uC/cm$^2$, the piezoelectric constant was −155 to −160 pm/V, and the deterioration rate of droplet speed (droplet ejection speed) was 2.8(%) as illustrated in Table 2.

On the other hand, in Comparative Example 1, a sufficient value was available as initial characteristics, however, with respect to the characteristics (immediately after repeated application of voltage $10^{10}$ times), deterioration in both residual polarization and piezoelectric constant was observed. That is to say, in Comparative Example 1, the breakdown voltage was 111V, the residual polarization Pr was 36 to 45 uC/cm$^2$, the piezoelectric constant was −135 to −150 pm/V, and the deterioration rate of droplet speed (droplet ejection speed) was 10.2(%) as illustrated in Table 2.

Embodiment 3

Figure 6:
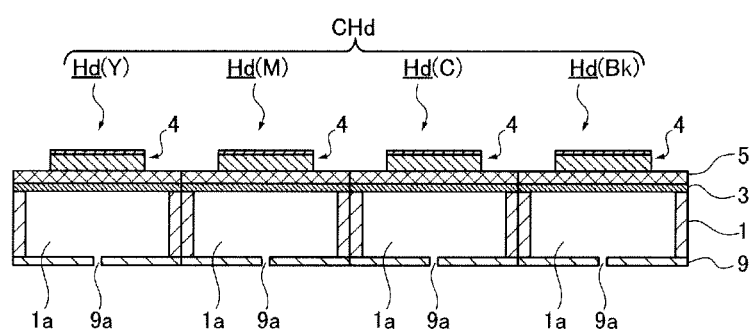
FIG. 6 is a schematic cross-sectional view of a color inkjet recording head (droplet discharge head) according to Embodiment 3, the color inkjet recording head being formed by arranging a plurality of the inkjet recording head (droplet discharge head) according to Embodiment 2 side by side.

FIG. 6 is a cross-sectional view illustrating a color inkjet recording head CHd in Embodiment 3, which is formed by arranging side by side multiple inkjet recording heads (droplet ejection head) Hd in FIG. 3. In FIG. 6, the film formation vibration plate 3, the nozzle plate 9, and the lower electrode 5 can be commonly used as illustrated. In FIG. 6, yellow (Y), magenta (M), cyan (C), and black (Bk) inkjet record heads are provided.

Embodiment 4

Figure 7:
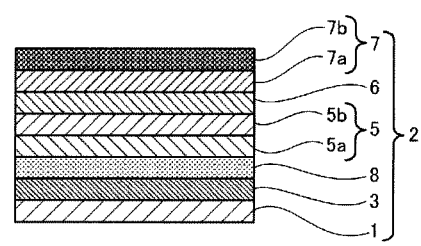
FIG. 7 is a cross-sectional view of a piezoelectric thin film element (piezoelectric actuator) according to Embodiment 4, the piezoelectric thin film element being formed by modifying part of the structure of the piezoelectric thin film element (piezoelectric actuator) in Embodiment 1, which is used in the color inkjet recording head (droplet discharge head) in FIG. 6.
Figure 8:
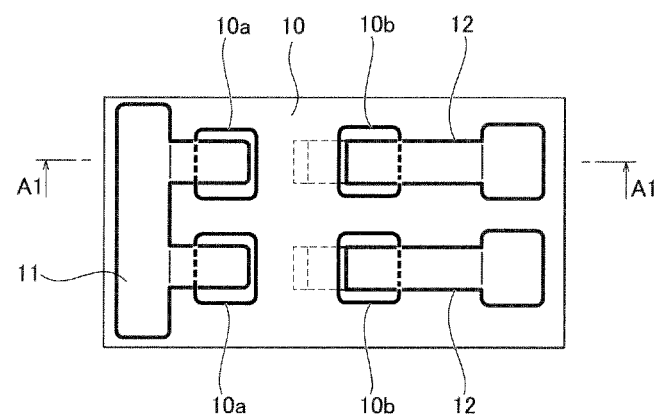
FIG. 8 is a partial plan view illustrating the wiring pattern of the color inkjet recording head (droplet discharge head) which uses the piezoelectric thin film element (piezoelectric actuator) in FIG. 7.
Figure 9:
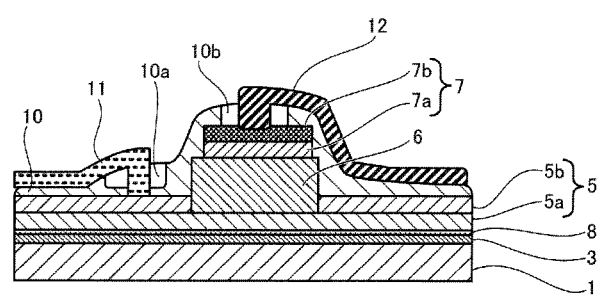
FIG. 9 is a cross-sectional view taken along a line A1-A1 in FIG. 8.

FIG. 7 illustrates an embodiment n which part of the stacked structure of the piezoelectric actuator illustrated in FIG. 2 is changed for the sake of wiring. FIG. 8 illustrates a plan view of electrode pattern to be applied for wiring a plurality of color inkjet recording heads CHd in FIG. 6 for the piezoelectric actuator in FIG. 7. FIG. 9 illustrates a cross-sectional view taken along a line A1-A1 in FIG. 8.

The piezoelectric actuator in Embodiment 4 in FIG. 7 has a substrate 1, and a piezoelectric thin film element (piezoelectric element) 2 provided on the substrate 1. As illustrated in FIG. 6, the piezoelectric thin film element (piezoelectric element) 2 has the film formation vibration plate 3 provided (stacked) on the substrate 1, and the electromechanical conversion element 4 provided (stacked) on the film formation vibration plate 3. The electromechanical conversion element 4 has the lower electrode 5 provided (stacked) on the film formation vibration plate 3, the piezoelectric thin film (hereinafter referred to as a piezoelectric material or a piezoelectric film as needed) 6 provided (stacked) on the lower electrode 5, and the upper electrode 7 provided (stacked) on the piezoelectric thin film 6.

As illustrated in FIG. 7, the lower electrode 5 of the piezoelectric thin film element 2 has a platinum electrode 5a (platinum electrode thin film which is a platinum electrode layer) which is a first electrode made of metal (metal material), and a conductive oxide film 5b which is a second electrode made of SrRuO film and provided (stacked) on the platinum electrode 5a. The platinum electrode 5a is provided (stacked) on the film formation vibration plate 3 with the titanium oxide adhesion layer 8 interposed therebetween.

In FIG. 7, the upper electrode 7 has a first upper electrode 7a which is a third electrode made of SrRuO film, and is provided (stacked) on the piezoelectric thin film 6, and a second upper electrode 7b which is a fourth electrode made of metal (metal material) and provided (stacked) on the first upper electrode 7a. The first upper electrode 7a corresponds to the upper electrode 7 in FIG. 2.

Adhesion between the platinum electrode 5a, the first electrode and the film formation vibration plate 3 (particularly $SiO_2$), the base plate is weak, and thus Ti, $TiO_2$, Ta, Rh, Pd, and others are used as described above. When a material such as Ti, $TiO_2$ is used, a titanium film such as a Ti or $TiO_2$ film is first stacked on the film formation vibration plate 3, and oxidized so as to form the above-described titanium oxide adhesion layer 8 on the film formation vibration plate 3. A vacuum film formation method such as a sputtering method or a vacuum deposition method is used as the method of manufacturing the titanium oxide adhesion layer 8.

For the second upper electrode 7b as the fourth electrode, a metal material of platinum Pt is used. The second upper electrode 7b is formed by sputtering a platinum film (having a thickness of 60 nm). Subsequently, a film of photoresist (TSMR8800) manufactured by Tokyo Ohka Kogyo Co., Ltd. was formed by spin coating method, and a resist pattern was formed by usual photolithography, and then an ICP etching device was used to produce a pattern. For the metal electrode layer, a material such as Ptir, Ru, titanium, Ta, Rh, or Pd is used.

The platinum electrode 5a as the first electrode and the second upper electrode 7b as the fourth electrode are arranged in a wiring pattern as illustrated in FIG. 8 to serve as the wiring electrode layer (wiring material layer) illustrated in FIGS. 8 and 9.

The platinum electrode 5a as the first electrode and the second upper electrode 7b as the fourth electrode are arranged in a wiring pattern as illustrated in FIG. 8 to serve as the wiring electrode layer (wiring material layer) illustrated in FIGS. 8 and 9.

The protective layer 10 is provided for the purpose of protecting the piezoelectric element interposed between the electrodes and the cross-sectional portion having a structure of elements against the environmental factors such as humidity. An oxide is used as the material of the protective layer 10, and the process of particularly ALD (Atomic Layer Deposition) method is used because close-packing properties are demanded. Specifically, an $Al_2O_3$-based ALD film is used. The thickness of the film is approximately 30 to 100 nm.

The protective layer (inter-layer insulating layer) 10 is used as an insulating layer for contact between a wiring electrode to be stacked in the subsequent step and the upper and lower electrodes of the piezoelectric element. The material may include an oxide, a nitride or a mixture of these. The thickness of the film is approximately 300 to 700 nm.

The protective layer (inter-layer insulating layer) 10 as an insulating protective layer was formed by forming a parylene film (having a thickness of 2 μm) by CVD. After the formation of the protective layer (inter-layer insulating layer) 10, a resist pattern was formed by usual photolithography, and then the pattern as illustrated in FIG. 8 was produced using RIE.

That is to say, after the formation of the protective layer (inter-layer insulating layer) 10, a through hole 10a for contact between a fifth electrode 11 as a wiring electrode layer and the platinum electrode 5a as the lower electrode, a through hole 10b for contact between a sixth electrode 12 as a wiring electrode layer and the fourth upper electrode 7b are formed. The through holes 10a, 10b are formed by using photolithography followed by etching. A remaining resist is removed by a method such as ashing using oxygen plasma.

The layer of the fifth electrode 11 is provided so as to cover the yellow (Y), magenta (M), cyan (C), and black (Bk) inkjet recording heads in FIG. 6, and is used as an outlet for a common electrode of the ferroelectric element (electromechanical conversion element 4) of the yellow (Y), magenta (M), cyan (C), and black (Bk) inkjet recording heads Hd in FIG. 6. In addition, the layer of the sixth electrode 12 is provided for each of the yellow (Y), magenta (M), cyan (C), and black (Bk) inkjet recording heads I-Id in FIG. 6, and is used as an outlet for individual electrode of the ferroelectric element (electromechanical conversion element 4) of each inkjet recording head.

The layers of the fifth, sixth electrodes 11, 12 are formed with a selected material which allows ohmic contact between upper and lower electrode materials, i.e., the platinum electrode 5a as the first electrode and the second upper electrode 7b as the fourth electrode.

Specifically, a wiring material may be used for the layers of the fifth, sixth electrodes 11, 12, the wiring material being composed of pure Al or Al containing a component for preventing hillock formation, such as several atomic % of Si. The fifth, sixth electrodes 11, 12 were formed by sputtering an Al film (having a thickness of 5 μm).

For the layers of the fifth, sixth electrodes 11, 12, wiring materials for semiconductor which mainly include Cu may be used in view of conductivity. The thicknesses of the layers of the fifth, sixth electrodes 11, 12 are determined in consideration of resistance due to a wiring distance so as to provide wiring resistance which has no adverse effect on driving the piezoelectric element. Specifically, in Al-based wiring, the thickness is set to approximately 1 μm. In the wiring electrode layer formed in this manner, a desired shape may be achieved using a photolithography technique. A remaining resist is removed by a method such as ashing using oxygen plasma.

The liquid cavity, i.e., the pressure cavity (compression cavity) 1a in FIG. 3 is formed in such a manner that a Si substrate is deeply etched to the position of the film formation vibration plate 3 by ICP (Inductively Coupled Plasma) etching using a photolithography technique, and thus the substrate in which the piezoelectric actuator element is formed is completed.

In the subsequent process, a nozzle plate, a drive circuit, and an ink liquid supply mechanism are assembled, thereby producing an inkjet head.

Embodiment 5

Figure 10:
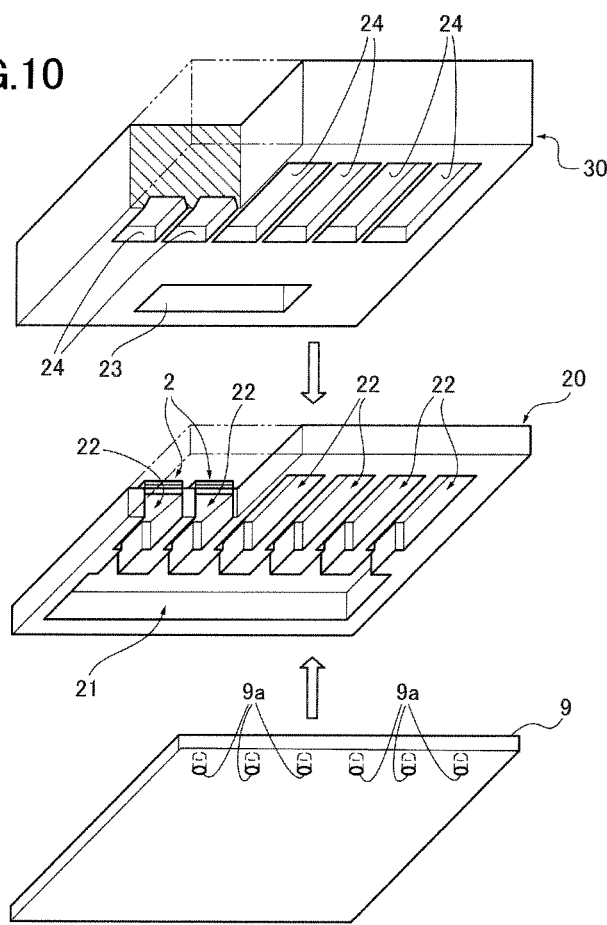
FIG. 10 is a schematic cross-sectional view illustrating another structure of a single inkjet head, i.e., an inkjet recording head (droplet ejection head) Hd in FIG. 3 according to Embodiment 5.
Figure 11:
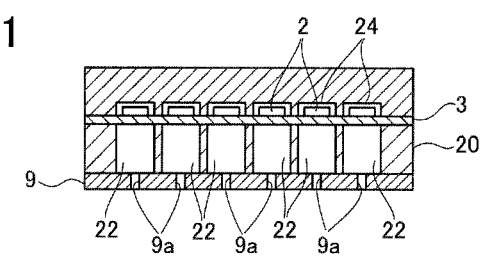
FIG. 11 is a schematic exploded perspective view of the inkjet recording head (droplet ejection head) illustrated in FIG. 10.

FIG. 10 is a schematic cross-sectional view illustrating another structure of a single inkjet head, i.e., an inkjet recording head (liquid drop head) Hd in FIG. 3 according to Embodiment 5. FIG. 11 is a schematic exploded perspective view of the inkjet recording head (liquid drop head) illustrated in FIG. 10.

In the inkjet recording head Hd in Embodiment 5, Si substrate (piezoelectric actuator substrate) 1 in the structure of the piezoelectric actuator illustrated in FIGS. 1 and 2 is processed to have a liquid cavity which serves as the compression cavity 1a in FIG. 3, and the nozzle plate 9 in FIG. 3 is installed to the Si substrate. The Si substrate (piezoelectric actuator substrate) 1 is provided with a structure of compression cavity, the structure being more specific than the structure in FIG. 3.

In FIGS. 10 and 11, there is provided a piezoelectric actuator substrate 20 composed of the same Si material as that of the substrate 1 in FIG. 3. The piezoelectric actuator substrate 20 includes a common channel 21, and a plurality of compression cavities 22 which are arranged side by side in the longitudinal direction of the common channel 21, and communicate with the common channel 21 at one ends. The common channel 21 and the compression cavities 22 are made through upward and downward in FIGS. 10 and 11. Each of the upper open ends of the plurality of compression cavities 22 are closed by the film formation vibration plate 3 of the piezoelectric thin film element 2 in FIG. 3.

A piezoelectric element cover plate 30 is attached to the upper surface of the piezoelectric actuator substrate 20. The piezoelectric element cover plate 30 includes an ink supply port 23 open to the common channel 21, and a housing recess 24 which houses the piezoelectric thin film elements 2. Furthermore, in the nozzle plate 9, nozzles (nozzle holes) 9a are formed through which other ends of the compression cavities 22 are open.

As illustrated in FIG. 10, the piezoelectric actuator substrate 20 is interposed between the piezoelectric element cover plate 30 and the nozzle plate 9 to be assembled together, thereby completing the inkjet recording head Hd.

As illustrated in FIGS. 10 and 11, the piezoelectric element having a structure in which the compression cavities 22 each serves as a liquid cavity (ink cavity), i.e., the inkjet recording head Hd also provided satisfactory characteristics.

In Embodiment 5, using a heat resistant adhesion layer prevents separation between electrode layers, and thus an operation failure due to disconnection does not occurs, thereby achieving the inkjet recording head Hd with a stable performance.

Embodiment 6

Figure 12:
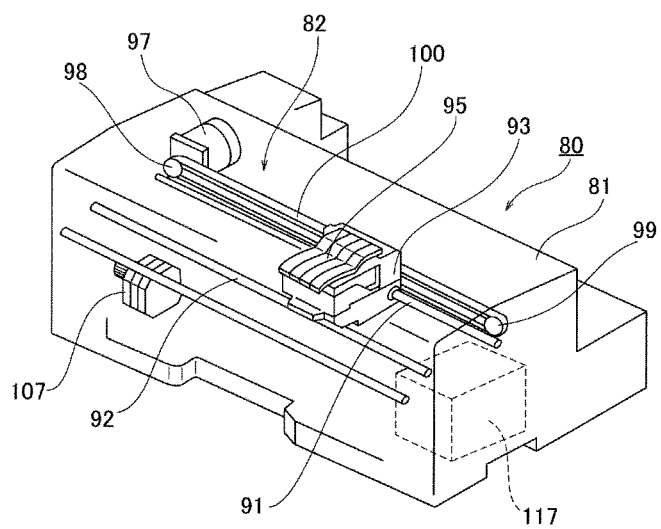
FIG. 12 is a perspective view of an inkjet recording device according to Embodiment 6, the inkjet recording device including the inkjet recording head (droplet ejection head) in Embodiment 5.

Next, an exemplary inkjet recording device equipped with an inkjet recording head 94 (hereinafter simply referred to as a recording head 94) which uses the color inkjet recording head CHd in FIG. 6 according to the present disclosure will be described with reference to FIGS. 12 and 13. FIG. 12 is a perspective view of the inkjet recording device, and FIG. 13 is a schematic illustration of the side view of the mechanical part of the inkjet recording device in FIG. 12.

The inkjet recording device in FIG. 12 has a recording device main body 81 which houses therein a printing mechanism unit 82. The printing mechanism unit 82 includes a carriage 93 which is movable in the main scanning direction of the recording device main body 81, a recording head 94 mounted to the carriage 93, and an ink cartridge 95 which supplies ink to the recording head 94.

Figure 13:
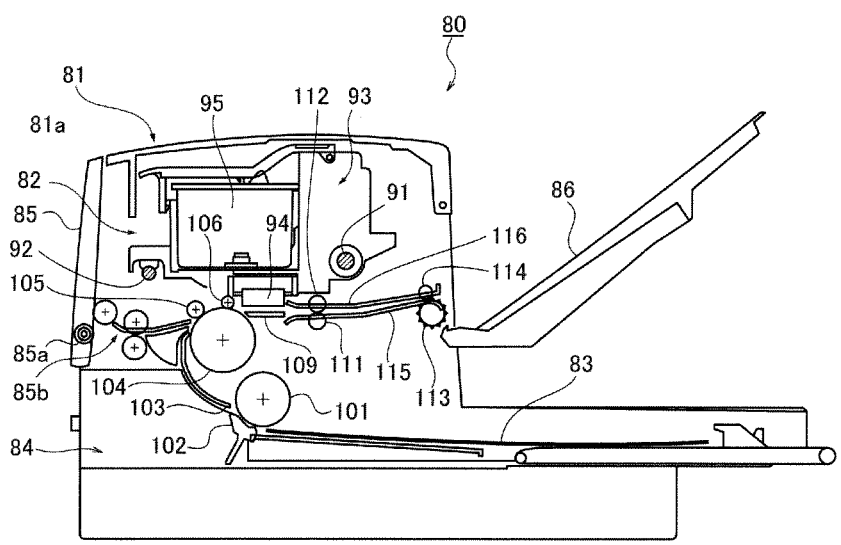
FIG. 13 is a schematic illustration of the side view of the mechanical part of the inkjet recording device in FIG. 12.

In addition, the inkjet recording device includes a paper feed cassette (or paper feed tray) 84 which can hold many sheets of paper 83 as illustrated in FIG. 13. The paper feed cassette (or paper feed tray) 84 can be detachably attached to a lower portion of the recording device main body 81 from a forward position.

In addition, the front of the recording device main body 81 is provided with a paper feed slot 81a above the paper feed cassette 84 and open forward. The paper feed slot 81a is openably closed by a manual feed tray 85 which can be turned up and down around a support shaft 85a. The manual feed tray 85 can be forwardly turned down to open in a substantially horizontal posture, so that the paper 83 can be manually fed to a paper feed roller mechanism 85b. The recording device main body 81 then takes in the paper 83 fed from the paper feed cassette 84 or the manual feed tray 85, a necessary image is recorded on the paper 83 by the printing mechanism unit 82, and subsequently the paper 83 is ejected to a paper ejection tray 86 mounted at the rear side.

The printing mechanism unit 82 slidably holds the carriage 93 in the main scanning direction by a main guide rod 91 and a sub guide rod 92 which are guide members horizontally supported at right and left side-plates (not illustrated). The carriage 93 includes the recording head 94 having four color inkjet recording heads CHd in FIG. 6 according to the present disclosure, which discharge ink droplet of colors of yellow (Y), cyan (C), magenta (M), black (Bk), respectively. The recording head 94 has a plurality of ink discharge ports (nozzles) which are arranged in a direction crossing the main scanning direction, and is mounted to the carriage 93 in such a manner that ink droplet discharge directions of the ink discharge ports (nozzles) point downward. Ink cartridges 95 for supplying respective color inks to the recording head 94 are replaceably attached to the carriage 93.

Each ink cartridge 95 has an air outlet which is disposed at an upper portion and communicates with the air, a supply port which is disposed at a lower portion and supplies ink to the recording head 94, and a porous body which is disposed inside the ink cartridge 95 and is filled with ink. In addition, the ink cartridge 95 holds an ink to be supplied to the recording head 94 by a capillary force of the porous body with a slight negative pressure. Although the recording head 94 for each color is used as the inkjet recording head herein, a single recording head may be used which has nozzles for discharging ink droplet of respective colors.

Here, the rear side (downstream in the paper conveying direction) of the carriage 93 is slidably held by the main guide rod 91, and the front side (upstream in the paper conveying direction) of the carriage 93 is slidably held by the sub guide rod 92. The printing mechanism unit 82 includes a main scanning motor 97 disposed near one end of the main guide rod 91 in order to move the carriage 93 in the main scanning direction, a drive pulley 98 driven to rotate by the main scanning motor 97, a driven pulley 99 disposed near the other end of the main guide rod 91, a timing belt 100 stretched between the drive pulley 98 and the driven pulley 99. The carriage 93 is fixed to the timing belt 100, and the carriage 93 is driven back and forth in the axial direction (extending direction) of the main guide rod 91 by the forward/reverse rotation of the main scanning motor 97.

On the other hand, in order to convey the paper 83 set in the paper feed cassette 84 below the recording head 94, the recording device main body 81 includes a paper feed roller 101 and a friction pad 102 which separate and feed the paper 83 from the paper feed cassette 84, a guide member 103 which guides the paper 83, a conveying roller 104 which reverses and conveys the fed paper 83, a conveying roller 105 pressed against the circumference surface of the conveying roller 104, and an end roller 106 which regulates the send angle of the paper 83 with respect to the conveying roller 104. The conveying roller 104 is driven to rotate by a sub scanning motor 107 via a gear rain.

In the recording device main body 81, a print receiving member 109, which is located below the recording head 94, is provided correspondingly to the movable range of the carriage 93 in the main scanning direction. The print receiving member 109 receives the paper 83, which has been sent out from the conveying roller 104, at a position below the recording head 94, and serves as a paper guide member which guides the paper 83 to the paper ejection tray 86. Downstream in the paper conveying direction of the print receiving member 109, there are provided a conveying roller 111 and a spur 112 which are driven to rotate in order to send the paper 83 in the paper ejection direction, a paper ejection roller 113 and a spur 114 which send the paper 83 to the paper ejection tray 86, and guide members 115,116 which form a paper ejection path.

During recording onto the paper 83, the recording head 94 is driven according to an image signal while moving the carriage 93, ink is discharged onto the paper 83 still in place for recording one line, the paper 83 is conveyed for a predetermined distance, and subsequently, the next line is recorded. Upon receiving a recording termination signal or a signal indicating that the rear end of the paper 83 reaches a recording area, recording operation is terminated, and the paper 83 is ejected.

At a position near the right end of the carriage 93 in the moving direction and outside the recording area, a recovery device 117 is provided for recovering a discharge failure of the recording head 94. The recovery device 117 has a cap unit, a sucking unit, and a cleaning unit.

During print standby, the carriage 93 is moved to the recovery device 117, and the recording head 94 is capped by a capping unit (not illustrated). Consequently, a discharge port of the recording head 94 is kept in a wet state, and thus a discharge failure, which is caused by ink drying at the discharge port of the recording head 94, is prevented.

Furthermore, during recording, ink, which is not in use, is discharged, so that the ink viscosity at all discharge ports is kept at a constant level, thereby maintaining stable discharge performance.

In the case where a discharge failure occurs, a discharge port (nozzle, not illustrated) of the recording head 94 is sealed by the capping unit, and air bubbles along with ink are sucked by the sucking unit (not illustrated) via a suction tube (not illustrated) through the discharge port (not illustrated) of the recording head 94. On the other hand, ink, dirt or the like adhering to the surface of the discharge port of the recording head 94 is removed by the cleaning unit (not illustrated), and thus the discharge failure is recovered. The ink which has been sucked is discharged to a waste ink container (not illustrated) which is disposed at a lower portion of the recording device main body 81, and is absorbed and held by an ink absorber (not illustrated) in the waste ink container.

In this manner, in the inkjet recording device, using a heat resistant adhesion layer prevents separation between electrode layers, and thus an ink droplet discharge failure due to a drive failure does not occurs, thereby achieving stable ink droplet discharge characteristics, preventing loss of an image, and improving image quality.

As described above, the piezoelectric thin film element according to an embodiment of the present disclosure includes the vibration plate (film formation vibration plate 3), the lower electrode 5 provided on the vibration plate (the film formation vibration plate 3) and made of a conductive oxide, the piezoelectric thin film 6 provided on the lower electrode 5 and made of a polycrystalline substance, and the upper electrode 7 provided on the piezoelectric thin film 6. Furthermore, the lower electrode 5 includes the titanium oxide film (the titanium oxide adhesion layer 8) formed on the vibration plate (the film formation vibration plate 3), the platinum film (the platinum electrode 5a) formed on the titanium oxide film (the titanium oxide adhesion layer 8), the conductive oxide film (the conductive oxide film 5b) formed on the platinum film (the platinum electrode 5a), and the platinum film and the conductive oxide film being a solid film with no holes.

According to the piezoelectric thin film element having the above configuration, the electromechanical conversion element 4 having the piezoelectric thin film (piezoelectric material) 6 interposed between the electrodes (between the lower electrode 5 and the upper electrode 7) is provided on the vibration plate (the film formation vibration plate 3) with the lower electrode 5 stacked on the vibration plate (the film formation vibration plate 3) by using the titanium oxide film (the titanium oxide adhesion layer 8) as an adhesion layer, which leads to achievement of a solid columnar-grain film with no holes in the lower electrode 5 and improvement of the crystalline state of the conductive oxide of the lower electrode 5.

The piezoelectric thin film element having the above configuration achieves a solid columnar-grain film with no holes in the lower electrode even when a conductive oxide film is formed by sputtering at 450 to 600° C. during the formation of the piezoelectric thin film element.

When the vector components of the spontaneous polarization axis of the piezoelectric thin film (piezoelectric material, i.e., piezoelectric film) 6, and the direction of the applied electric field match, expansion/contraction of the piezoelectric thin film is caused effectively associated with an increase/decrease of the strength of the applied electric field, and thus a high piezoelectric constant is obtained. It is the most preferable that the spontaneous polarization axis of the piezoelectric thin film (piezoelectric film) 6 and the direction of the applied electric field completely match. In order to reduce variation in the amount of discharged Ink, it is preferable that variation in the piezoelectric performance of the piezoelectric thin film (piezoelectric film) 6 within the relevant film is low. In consideration of the above points, a piezoelectric film having superior crystal orientation is preferably used.

As describe above, it is necessary to form a piezoelectric thin film element in which no hole is created. When the titanium oxide adhesion layer (titanium oxide film) 8 is incorporated during the formation of the piezoelectric thin film element, even after a conductive oxide (SRO, i.e., $SrRuO_3$) is formed, no hole is found in the film and the surface of the lower electrode 5 by observation with a scanning electron microscope. Thus, excessive diffusion of Pb into the lower electrode, formation of a leak path, and concentration of electric field can be reduced, and thus the breakdown voltage of the piezoelectric element can be increased. In addition, the deterioration rate of droplet speed can be reduced. Because no hole is present on the platinum (the platinum electrode 5a), the continuity of a conductive oxide crystal is not blocked, and it is possible to make the average particle diameter of the conductive oxide (SRO, i.e., $SrRuO_3$) greater than the average particle diameter of the platinum film. In addition, the surface roughness of the lower electrode film can be reduced.

Furthermore, in the piezoelectric thin film element according to an embodiment of the present disclosure, a Si substrate is used for the substrate 1, and the vibration plate (the film formation vibration plate 3) is provided on the Si substrate.

With this configuration, when the piezoelectric thin film element serves as the piezoelectric actuator used in the inkjet recording head, the for ink supply facing the vibration plate (the film formation vibration plate 3) can be easily formed in the Si substrate by etching.

Furthermore, in the piezoelectric thin film element according to an embodiment of the present disclosure, the conductive oxide is composed of a material with a lattice constant matching the lattice constant of the platinum film (the platinum electrode 5a), and thus the average particle diameter of the conductive oxide film in the transverse direction is greater than the average particle diameter of the platinum film (the platinum electrode 5a) in the transverse direction.

With this configuration, the crystal grains of the conductive oxide film increase in size, and thus the characteristics of the piezoelectric element (piezoelectric thin film element) having the piezoelectric thin film can be improved.

When the surface roughness of the conductive oxide film is large, no hole is formed in conductive oxide film, and thus the average particle diameter of the conductive oxide film reduces, and therefore, in contrast to the case where holes are formed in the platinum electrode 5a, the number of grain boundaries of the conductive oxide film can be reduced by reducing the surface roughness of the conductive oxide film. In contrast to another conductive oxide film having a great number of grain boundaries, the number of grain boundaries of the conductive oxide film is lowered, and thus the leak current can be reduced. Consequently, concentration of electric field due to the presence of holes does not occur in any part of the conductive oxide film, and thus the breakdown voltage of the piezoelectric element, in which the piezoelectric thin film 6 is interposed between electrodes, does not reduce but can be increased.

In the piezoelectric thin film element according to an embodiment of the present disclosure, the conductive oxide film is strontium ruthenate $SrRuO_3$ (i.e., SRO).

With this configuration, the crystal grains of the conductive oxide SRO, i.e., $SrRuO_3$ film increase in size, and thus the characteristics of the piezoelectric element (piezoelectric thin film element) having the piezoelectric thin film can be improved. For example, the crystal grains of SRO ($SrRuO_3$) film increase in size, and thus the characteristics of the piezoelectric element (piezoelectric thin film element) having the piezoelectric thin film can be improved.

When the surface roughness of the conductive oxide film is large, no hole is formed in a conductive oxide SRO film (SRO film), and thus the average particle diameter of the SRO film reduces, and therefore, in contrast to the case where holes are formed in the platinum electrode 5a, the number of grain boundaries of the SRO film can be reduced by reducing the surface roughness of the SRO film. In contrast to another SRO film having a great number of grain boundaries, the number of grain boundaries of the SRO film is lowered, and thus the leak current can be reduced. Consequently, concentration of electric field due to the presence of holes does not occur in any part of the SRO film, and thus the breakdown voltage of the piezoelectric element, in which the piezoelectric thin film 6 is interposed between electrodes, does not reduce but can be increased.

As describe above, it is necessary to form a piezoelectric thin film element in which no hole is created. When the titanium oxide adhesion layer (titanium oxide film) 8 is incorporated, even after a conductive oxide SRO ($SrRuO_3$) is formed, no hole is found in the film and the surface of the lower electrode 5 by observation with a scanning electron microscope. Thus, excessive diffusion of Pb into the lower electrode, formation of a leak path, and concentration of electric field can be reduced, and thus the breakdown voltage of the piezoelectric element can be increased. In addition, the deterioration rate of droplet speed can be reduced. Because no hole is present on the platinum (the platinum electrode 5a), the continuity of a conductive oxide crystal is not blocked, and the average particle diameter of the conductive oxide $SrRuO_3$ can be made greater than the average particle diameter of the platinum film. In addition, the surface roughness of the lower electrode film can be reduced.

In the piezoelectric thin film element according to an embodiment of the present disclosure, the conductive oxide is composed of strontium ruthenate (SRO), and has a perovskite structure with a preferred-(111)orientation.

With this configuration, $SrRuO_3$ (strontium ruthenate) has the perovskite-type crystal structure, the same perovskite-type crystal structure as PZT, has superior bondability at the interface, allows epitaxial growth of PZT to be easily achieved, and provides superior characteristics of Pb diffusion barrier layer. In addition, platinum has a high self-orientation due to its face-centered cubic lattice (FCC) structure which is a close-packing structure. Thus, even when a platinum film is formed on an amorphous material such as $SiO_2$ which is a material of the vibration plate (the film formation vibration plate 3), the platinum film is highly oriented with (111). Strontium ruthenate (SRO), a conductive oxide with (111) orientation, when being stacked on the platinum electrode 5a with (111) orientation, exhibits better orientation.

In the piezoelectric thin film element according to an embodiment of the present disclosure, the thickness of the platinum film is less than or equal to 150 nm.

With this configuration, the platinum film (the platinum electrode 5a) has a thickness of 150 nm or less, and thus can be formed as the lower electrode (the platinum electrode 5a) by sputtering easily and quickly and cost reduction can be achieved in contrast to the case where the thickness of the platinum film greater than 150 nm.

In the piezoelectric thin film element according to an embodiment of the present disclosure, the piezoelectric thin film is formed by Sol-Gel method.

With this configuration, a layer of a piezoelectric thin film having a desired thickness can be easily obtained.

In the method of manufacturing a piezoelectric thin film element according to an embodiment of the present disclosure, the conductive oxide film is formed by sputtering at 450 to 600° C.

With this configuration, it is possible to form a conductive oxide ($SrRuO_3$) film which has a favorable crystalline state and is highly oriented with the (111) plane. When the electromechanical conversion element having the piezoelectric thin film (piezoelectric material) interposed between the electrodes is provided on the vibration plate, a solid columnar-grain film with no holes can be achieved at the lower electrode. The upper limit of the temperature can be set to a level which is sufficiently lower than 650° C., and thus heating control is easy.

In the method of manufacturing a piezoelectric thin film element, the titanium oxide film is formed in the following manner: a titanium film is formed on an insulating film, and the titanium film is thermally oxidized by RTA device.

With the manufacturing method, the crystalline state of the titanium $O_2$ film (titanium oxide film) achieved by oxidation with a RTA device is more favorable than the crystalline state achieved by oxidation with a typical furnace. This is because a titanium film which is likely to be oxidized forms several crystal structures at a low temperature when oxidation is achieved by a normal heating furnace, and thus the formed crystal structures need to be destroyed. Consequently, oxidation by a RTA device with a high temperature increase rate is advantageous in forming high quality crystal.

In the droplet discharge head (inkjet recording head) according to an embodiment of the present disclosure, the substrate of the piezoelectric thin film element is provided with a compression cavity which is open to upper and lower sides, the upper open end of the compression cavity is closed by the vibration plate, the lower open end of the compression cavity is closed by a nozzle plate, the nozzle plate is provided with a nozzle for droplet discharge, the nozzle being communicating with the compression cavity. Thus, the droplet discharge head is capable of ejecting a liquid supplied into the cavity through the nozzle by using a pressure acted from the vibration plate.

A droplet discharge head (inkjet recording head) having the above piezoelectric thin film element is capable of maintaining favorable ink discharge characteristics and achieving stable ink discharge characteristics for continuous discharge.

The inkjet recording device according to an embodiment of the present disclosure includes a droplet discharge head.

In addition, an inkjet recording device having the above piezoelectric thin film element is capable of maintaining favorable ink discharge characteristics and achieving stable ink discharge characteristics for continuous discharge, and thus a recording state can be favorably maintained.

According to the piezoelectric thin film element having the above configuration, an electromechanical conversion element having the piezoelectric thin film (piezoelectric material) interposed between electrodes is provided on the vibration plate with the lower electrode stacked on the vibration plate by using the titanium oxide film as an adhesion layer, which thereby leads to achievement of a solid columnar-grain film with no holes in the lower electrode and improvement of the crystalline state of the conductive oxide of the lower electrode.

The piezoelectric thin film element having the above configuration achieves a solid columnar-grain film with no holes in the lower electrode even when the conductive oxide film is formed by sputtering at 450 to 600° C. during the formation of the piezoelectric thin film element.

In addition, a droplet discharge head and an inkjet recording device which have the above piezoelectric thin film element are each capable of maintaining favorable ink discharge characteristics and achieving stable ink discharge characteristics for continuous discharge.

Although the embodiments of the present disclosure have been described above, the present disclosure is not limited thereto. It should be appreciated that variations may be made in the embodiments described by persons skilled in the art without departing from the scope of the present disclosure.

What is claimed is:

1. A piezoelectric thin film element, comprising:
    a vibration plate;
    a titanium oxide film formed of $TiO_2$ on the vibration plate;
    a lower electrode provided on the titanium oxide film of $TiO_2$;
    a piezoelectric thin film provided on the lower electrode and made of a polycrystalline substance;
    an upper electrode provided on the piezoelectric thin film;
    a protective insulating layer comprising a through hole and provided on at least a portion of each of the lower electrode, the piezoelectric thin film, and the upper electrode; and
    a wiring electrode having a portion thereof provided in the through hole of the protective insulating layer,
    wherein the lower electrode includes
        a platinum film formed on the titanium oxide film, and
        a conductive oxide film formed on the platinum film, and
    wherein the portion of the wiring electrode is connected to the conductive oxide film of the lower electrode through the through hole.

2. The piezoelectric thin film element according to claim 1, wherein the vibration plate is provided on a substrate, and a Si substrate is used as the substrate.

3. The piezoelectric thin film element according to claim 1,
    wherein the conductive oxide film is made of a material with a lattice constant which matches a lattice constant of the platinum film, and
    an average particle diameter of the conductive oxide film in a transverse direction is greater than an average particle diameter of the platinum film in the transverse direction.

4. The piezoelectric thin film element according to claim 1, wherein the conductive oxide film is made of a strontium ruthenate (SRO).

5. The piezoelectric thin film element according to claim 1, wherein the conductive oxide film is made of a strontium ruthenate (SRO), and has a perovskite structure with preferred-(111) orientation.

6. The piezoelectric thin film element according to claim 1, wherein a thickness of the platinum film is less than or equal to 250 nm.

7. The piezoelectric thin film element according to claim 1, wherein the piezoelectric thin film is formed by Sol-Gel method.

8. A method of manufacturing the piezoelectric thin film element according to claim 1, the method comprising forming the conductive oxide film by sputtering at 450 to 600° C.

9. A method of manufacturing the piezoelectric thin film element according to claim 1, the method comprising forming the titanium oxide film according to claim 1 by forming a titanium film insulating film, and then by oxidizing the titanium film thermally by rapid thermal annealing.

10. A droplet discharge head,
    wherein the substrate of the piezoelectric thin film element according to claim 2 is provided with a compression cavity which is open to upper and lower sides,
    an upper open end of the compression cavity is closed by the vibration plate,
    a lower open end of the compression cavity is closed by a nozzle plate,
    the nozzle plate is provided with a nozzle for droplet discharge, the nozzle being communicating with the compression cavity, and
    the droplet discharge head is capable of ejecting a liquid supplied into the cavity through the nozzle by using a pressure acted from the vibration plate.

11. An inkjet record device comprising the droplet discharge head according to claim 10.

12. The piezoelectric thin film element according to claim 2, wherein the conductive oxide film is an SrRuO3 film, an average particle diameter of the SrRuO3 film in a lateral direction is 120 to 170 nm, and an average particle diameter of the platinum film in a lateral direction is 100 to 80 nm.

* * * * *